United States Patent
Eshun et al.

(10) Patent No.: US 7,427,551 B2
(45) Date of Patent: Sep. 23, 2008

(54) HIGH TOLERANCE TCR BALANCED HIGH CURRENT RESISTOR FOR RF CMOS AND RF SIGE BICMOS APPLICATIONS AND CADENCED BASED HIERARCHICAL PARAMETERIZED CELL DESIGN KIT WITH TUNABLE TCR AND ESD RESISTOR BALLASTING FEATURE

(75) Inventors: Ebenezer E. Eshun, Essex Junction, VT (US); Steven H. Voldman, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 313 days.

(21) Appl. No.: 11/124,247

(22) Filed: May 6, 2005

(65) Prior Publication Data

US 2005/0221572 A1 Oct. 6, 2005

Related U.S. Application Data

(62) Division of application No. 10/707,863, filed on Jan. 19, 2004, now Pat. No. 6,969,903.

(51) Int. Cl.
*H01L 21/3205* (2006.01)
(52) U.S. Cl. ...................................... 438/385; 438/382
(58) Field of Classification Search ................ 438/382, 438/384, 385
See application file for complete search history.

(56) References Cited

U.S. PATENT DOCUMENTS

| | | | |
|---|---|---|---|
| 4,668,581 A | 5/1987 | Luc et al. | |
| 4,866,507 A | 9/1989 | Jacobs et al. | |
| 5,045,904 A | 9/1991 | Kobayahi et al. | |
| 5,106,461 A | 4/1992 | Volfson et al. | |
| 5,164,699 A | 11/1992 | Smith et al. | |
| 5,182,632 A | 1/1993 | Bechtel et al. | |
| 5,275,963 A | 1/1994 | Cederbaum et al. | |
| 5,841,184 A | 11/1998 | Li | |
| 5,872,695 A | 2/1999 | Fasano et al. | |
| 6,379,745 B1 | 4/2002 | Kydd et al. | |
| 6,426,268 B1 * | 7/2002 | Huppert et al. | 438/384 |
| 6,436,814 B1 | 8/2002 | Horak et al. | |
| 6,993,828 B2 * | 2/2006 | Ha et al. | 29/620 |
| 2007/0040239 A1 * | 2/2007 | Chinthakindi et al. | 257/536 |
| 2007/0046421 A1 * | 3/2007 | Gogineni et al. | 338/309 |

* cited by examiner

*Primary Examiner*—Zandra Smith
*Assistant Examiner*—Pamela E Perkins
(74) *Attorney, Agent, or Firm*—Scully, Scott, Murphy & Presser, P.C.; Anthony J. Canale (57) ABSTRACT

A resistor device structure and method of manufacture therefore, wherein the resistor device structure invention includes a plurality of alternating conductive film and insulative film layers, at least two of the conductive film layers being electrically connected in parallel to provide for high current flow through the resistor device at high frequencies with increased temperature and mechanical stability. The alternating conductive film and insulative film layers may be of a planar or non-planar geometric spatial orientation. The alternating conductive film and insulative film layers may include lateral and vertical portions designed to enable a uniform current density flow within the structure itself through a self-ballasting effect within the physical resistor. A computer aided design tool with graphical and schematic features is provided to enable generation of hierarchical parameterized cells for a resistor element with the ability to provide customization, personalization and tunability of TCR, TCR matching, and high current and ESD robustness.

11 Claims, 11 Drawing Sheets

HIGH TOLERANCE TCR BALANCED HIGH CURRENT RESISTOR FOR RF CMOS AND RF SIGE BICMOS APPLICATIONS AND CADENCED BASED HIERARCHICAL PARAMETERIZED CELL DESIGN KIT WITH TUNABLE TCR AND ESD RESISTOR BALLASTING FEATURE

RELATED APPLICATIONS

This application is a divisional of U.S. application Ser. No. 10/707,863, filed Jan. 19, 2004 now U.S. Pat. No. 6,969,903.

BACKGROUND OF INVENTION

1. Field of the Invention

The present invention relates to semiconductor devices and methods of manufacturing thereof, and more particularly to a semiconductor resistor structure optimized for tolerance and high current and a method of fabrication thereof. More specifically, the present invention provides a high tolerance Temperature Coefficient of Resistance (TCR) balanced high current resistor for RF CMOS and RF SiGe BiCMOS applications and a computer aided design kit for designing the same.

2. Background of the Invention

Optimization of passive elements for tolerance and high current is valuable for RF technologies. In RF circuit applications, precision resistors are needed for I/O circuitry implementing both radio frequency (RF) CMOS an RF SiGe technology. High tolerance resistors are important for accurate prediction of models and statistical control. Moreover, in RF devices and circuits, high tolerance resistors are needed that have good linearity; a low temperature coefficient of resistance (TCR) which is the normalized first derivative of resistance and temperature, and provides an adequate means to measure the performance of a resistor; a high quality factor (Q); and are suitable for high current applications.

In high current RF applications, it is desirable that resistors maintain their structural integrity at high currents. In current multiple inter-level dielectric film stack structures, there exist materials with potentially different thermal and mechanical properties which can influence the temperature distribution within the resistor element and also the mechanical stress and strain in metal and insulation regions. Conventional metal resistor structures subjected to high currents above a critical current-to-failure point, can result in metal blistering, extrusion, and melting of the metal resistor regions. Additionally, subjecting a conventional resistor to high current may result in a thermal gradient in the surrounding insulator that may exceed the yield stress and result in insulator cracking. The above phenomena both reduce the integrity of the dielectric and semiconductor chips when subjected to high current.

Further, in RF CMOS, or RF SiGe, the usage of resistors in series with RF MOSFETs for resistor ballasting in source, drain, and gate regions are valuable for ESD protection. For an RF MOSFET, series resistance is important to minimize for RF performance. Hence, having a low resistance in the source and the drain are important for good RF characteristics. Source and drain resistance are lowered using salicide regions on the source and drain diffusion regions, but salicide near the gate impacts the ESD robustness of the device. For an RF MOSFET device, it is key to provide ballasting effects as well as low resistance. Adding extra resistor elements increase the loading capacitance on the circuit and impacts area. Hence, finding a means to provide low resistance for RF functionality but ballasting for ESD robustness is key to providing a good RF MOSFET.

It is also well known that current drive in devices at high current is not uniform, largely due to non-uniform temperature distribution in such devices when driven at high currents. Thus, to provide uniformity of current drive, a device which has a more uniform current distribution as a function of device dimensions is an advantage.

Moreover, for RF bipolar and SiGe transistors, a means for establishing uniform current in a transistor to maximize its high current capability is key for power amplifier applications, ESD networks and other applications. Current uniformity can lead to an improved net performance by avoiding increasing a structure size to provide an equivalent drive strength. Additionally, using resistor ballasting in a base region can lead to uniformity of input current. Additionally, using a resistor ballasting in an emitter structure can provide both thermal and electrical stability in a circuit. Additionally, it is important that the element does not structurally fail due to high currents. For differential circuits, it is important that good matching characteristics are present in the physical elements.

It would therefore be highly desirable to provide a semiconductor resistor structure and method of fabrication that is customized to achieve a desired (optimized) TCR, and preferably, a low net Temperature Coefficient of Resistance (TCR) value at high currents and in a joule-heating regime of operation. To this end, it would be desirable to provide a semiconductor resistor element structure and method of fabrication for power amplifiers, and ESD applications that provides a tunable Temperature Coefficient of Resistance for circuit linearity.

It would furthermore be highly desirable to provide a semiconductor resistor element structure and method of fabrication, wherein the resistor element is capable of carrying high currents without failure, and is designed to exhibit internal self-resistor ballasting to maintain a uniform current density and thermal gradient for uniform current distribution and minimization of thermal stress.

It would moreover be highly desirable to provide a semiconductor RF MOSFET device implementing a high resistance element that is physically small, provides a high Q factor, and renders the device electrically and thermally stable at high temperatures and high currents.

ESD protection circuits for input nodes must also support quality dc, ac, and RF model capability in order to co-design ESD circuits for analog and RF circuits. With the growth of the high-speed data rate transmission, optical interconnect, wireless and wired marketplaces, the breadth of applications and requirements is broad. Each type of application space has a wide range of power supply conditions, number of independent power domains, and circuit performance objectives. As a result, an ESD design system which has dc and RF characterized models, design flexibility, automation, ESD characterization, and satisfies digital, analog and RF circuits is required to design and co-synthesize ESD needs of mixed signal RF technology.

The ability to design a resistor element so that co-synthesis of the ESD and the functional RF needs to insure integrity of the resistor element is critical in future technologies.

Much effort has been expended by industry to protect electronic devices from ESD damage. Traditionally, ESD designs are custom designed using graphical systems. ESD ground rules and structures are typically built into the designs requiring a custom layout. This has lead to custom design for digital products such as DRAMs, SRAMs, microprocessors, ASIC development and foundry technologies. This design practice does not allow for the flexibility needed for RF applications. A difficulty in the design of RF ESD solutions is that traditionally, specific designs are fixed in size in order to achieve verifiable ESD results for a technology. The difficulty with analog and RF technology is that a wide range of circuit applications exists where one ESP size structure is not suitable due to loading of the circuit. A second issue is that the co-synthesis of the circuit and the circuit must be done to properly evaluate the RF performance objectives of a resistor element. RF characterization of the resistor or network that is flexible with the device size is important for the evaluation of the tradeoffs of RF performance and ESD. A third issue for RF mixed signal designs, there are analog and digital circuits.

In this environment, the verification and checking is necessary to evaluate ESD robustness of the resistor element and the ESD robustness of the semiconductor chip. The verification of the existence of the ballast resistor elements, the pads, the ESD input circuit, the ESD power clamp circuit, ESD rail-to-rail circuits, interconnects between the input pad and the ESD circuits, interconnects between power pads and the ESD power rails, the interconnects between two power rails for rail-to-rail ESD networks, the verification of ESD rail-to-rail type designs between functional blocks, verification of type of ESD networks on analog, digital and RF circuits, verification of the correct ESD network for a given chip circuit, verification of the critical size of the resistor, and the interconnects, verification of the size and adequacy of the ESD network are all important to provide ESD protection of RF BiCMOS, RF BiCMOS Silicon Germanium and RF CMOS applications.

It would thus be further highly desirable to provide a computer aided design tool with the ability to provide customization and personalization of the internal ballasting (both lateral and vertical), variable TCR, TCR matching, high current robustness, electrothermal optimization and ESD robustness.

It would additionally be desirable to provide a computer aided design tool with graphical and schematic features hierarchical parameterized cell for a resistor element with the ability to provide customization, personalization and tunability of TCR, TCR matching, and high current robustness and ESD robustness.

It would further be highly desirable to provide a computer aided design tool with graphical and schematic features hierarchical parameterized cell which allows graphical or schematic optimization and autogeneration of the resistor element.

SUMMARY OF INVENTION

It is an object of the present invention to provide a resistor structure that maintains structural and material integrity at high current and temperature, and has a low net thermal coefficient of resistance and a high melting temperature.

It is a further objective to provide a resistor structure that provides a uniform current within the structure and provides self-ballasting within the physical resistor structure to maintain a uniform current density within the resistor itself, especially at high frequencies including RF frequencies.

It is a further objective to provide a semiconductor resistor structure and method of fabrication that is customized to achieve a desired (optimized) TCR, and preferably, a low net Temperature Coefficient of Resistance (TCR) value at high currents and in a joule-heating regime of operation. To this end, it is advantageous to provide a semiconductor resistor element structure and method of fabrication for use in power amplifiers, and ESD circuit applications that provides a tunable Temperature Coefficient of Resistance for circuit linearity.

It is a further objective to provide a semiconductor resistor element structure and method of fabrication, wherein the resistor element is capable of carrying high currents without failure, and is designed to exhibit internal self-resistor ballasting (both laterally and vertically) to maintain a uniform current density and thermal gradient for uniform current distribution and minimization of thermal stress.

It is a further objective to provide a semiconductor RF MOSFET device implementing a high resistance value element that is physically small, provides a high Q factor, and renders the device electrically and thermally stable at high temperatures and high currents.

In accordance with these and other objectives, there is provided a semiconductor resistor device structure and method of manufacture therefore, wherein the semiconductor resistor device structure invention includes a plurality of alternating conductive film and insulative film layers, at least two of the conductive film layers being electrically connected in parallel to provide for high current flow through the resistor device at RF frequencies with increased temperature and mechanical stability. The alternating conductive film and insulative film layers may be of a planar or non-planar geometric spatial orientation. The alternating conductive film and insulative film layers may include lateral and vertical portions designed to enable a uniform current density flow within the structure itself through a self-ballasting effect within the physical resistor element. This enables maintenance of a uniform current density within the resistor itself at high frequencies (RF frequencies), e.g., in the vertical and lateral portions of the resistor element. The self-ballasting effect is produced by a plurality of thin conductive and insulating films, wherein the thin insulator films minimize the thermal gradients between successive conductive and insulating films. The resistor element of thin conductive and insulating films are deposited atop a planar surface or non-planar surface such as a trough or a grooved structure.

Further in the achievement of the above-mentioned objects, there is additionally provided a computer-aided design system and methodology having graphical and schematic features enabling generation of a hierarchical parameterized cell for a resistor element with the ability to provide customization, personalization personalization of the lateral and vertical ballasting and tunability of TCR, TCR matching, and high current robustness and ESD robustness and electrothermal optimization. Such a computer aided design tool includes a graphical and schematic hierarchical parameterized cell which allows graphical or schematic optimization and autogeneration of the resistor element and circuits including the resistor element.

Specifically, the computer-aided design system and methodology enables the generation of parameterized cells (p-cells) that are data structures used in the design of semiconductor devices and circuits and particularly, design of semiconductor resistor device structures having a plurality of alternating conductive film and insulator film layers according to the present invention. The system and methodology enables the autogeneration of a semiconductor resistor device structure utilizing the p-cells in a manner that enables the formed resistor device to exhibit optimized TCR value by enabling customization which provides a TCR utilizing a plurality of conductive films of different physical size, thicknesses and TCR material values in either planar or non-planar geometric spatial orientation, and a plurality of insulative films having different thermal properties; i.e., Low-K materials, SiO₂, porous Si, and SiLK in corresponding planar or non-planar geometric spatial orientation.

Advantageously, the novel resistive element designed according to the methodology of the invention may be integrated with interlevel dielectric films and other conductive wires and via structures in an integrated semiconductor chip or be integrated with a passive or active structural element; i.e., inductors, capacitors, MOSFETs, NPN transistor, varacator or other RF CMOS and RF SiGe elements well known within the ordinary skill of the art.

BRIEF DESCRIPTION OF DRAWINGS

Further features, aspects and advantages of the structures and methods of the present invention will become better understood with regard to the following description, appended claims, and accompanying drawings where:

DETAILED DESCRIPTION

Figure 1A:
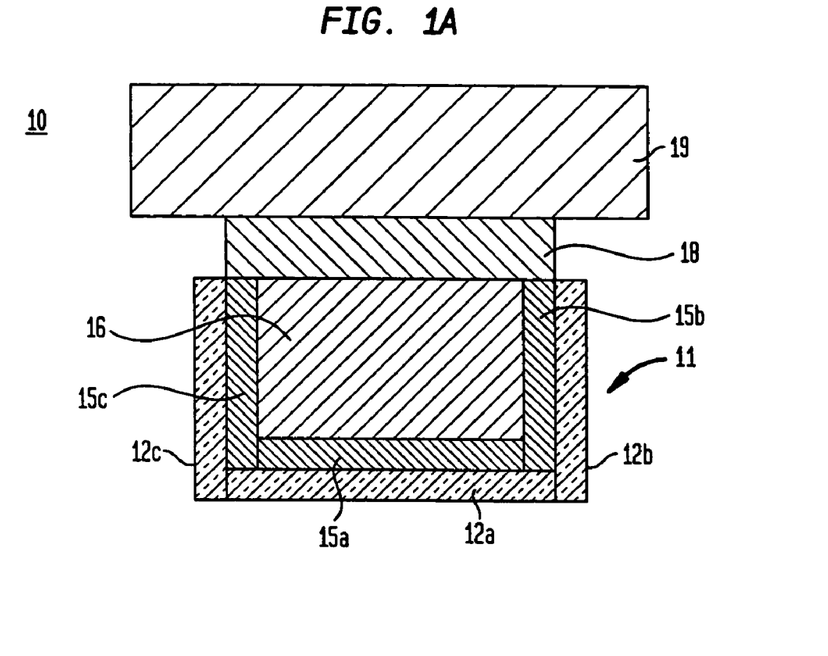
FIGS. 1(a)-1(d) depict various embodiments of the resistor element of the present invention (through cross sectional views) that includes conductive elements in a trough configuration.

Referring now to the drawings, and more particularly to FIG. 1(a), there is depicted a novel resistive structure 10 according to a first embodiment of the invention. In this embodiment, the resistive structure 10 is formed in a trough 11, for example, formed in a substrate (not shown) having a layer of dielectric material conforming to the base and sidewalls. The trough structure 11 comprises a bottom portion of dielectric material 12a and two parallel sidewall formations 12b, 12c of dielectric material. Examples of insulative dielectric materials for the portions 12a-12c include, but are not limited to: low-k materials, SiLK®, an oxide, nitride, oxynitride or any combination thereof including multilayers, porous or non-porous inorganic and/or organic dielectrics formed by a deposition process such as CVD, PECVD, chemical solution deposition, atomic layer deposition and other like deposition processes. Thus, the dielectric material may be comprised of SiN, SiO₂, a polyimide polymer, a siloxane polymer, a silsesquioxane polymer, diamond-like carbon materials, fluorinated diamond-like carbon materials and the like including combinations and multilayers thereof.

In the embodiment depicted in FIG. 1(a), resistive elements are formed within the trough structure 11 by utilizing a deposition process such as, for example, sputtering, plating, evaporation, chemical vapor deposition (CVD), plasma enhanced chemical vapor deposition (PECVD), chemical solution deposition, atomic layer deposition and other like deposition processes. The first resistor material 15 typically has a thickness, after deposition, of from about 50 to about 1000 Å, with a thickness of from about 50 to about 500 Å being more preferred and includes an outer conductor portion including lateral conductive film 115a and two parallel vertical formations 15b, 15c of conductive material. The resistive structure further comprises an inner conductive portion 16. The outer and inner conductor portions 15a, 15b, 15c and 16 preferably comprise a resistive material including but not limited to: Ta, TaN, Ti, TiN, W, WN. In this structure, refractory metal films are ideal because of the high melting temperature, however, the material chosen may also be chosen for the TCR values. The conductive material forming outer conductor portions 15a, 15b, 15c has a first sheet resistance value and a first TCR value and, the conductive material forming inner conductor portions 16 may have a second sheet resistance value and a second TCR value. The TCR values may be positive or negative depending on the type of resistor material used, and the sheet resistance is also dependent on the type of material used as well as its length and area. As shown in FIG. 1, the resistive structure 10 may be formed as part of an interlevel circuit or comprise part of an interconnect structure as shown connected to another wire level 19 by a conducting via 18. As shown in FIG. 1(a), the via connects all conductive materials of the resistive element 10.

Figure 1B:
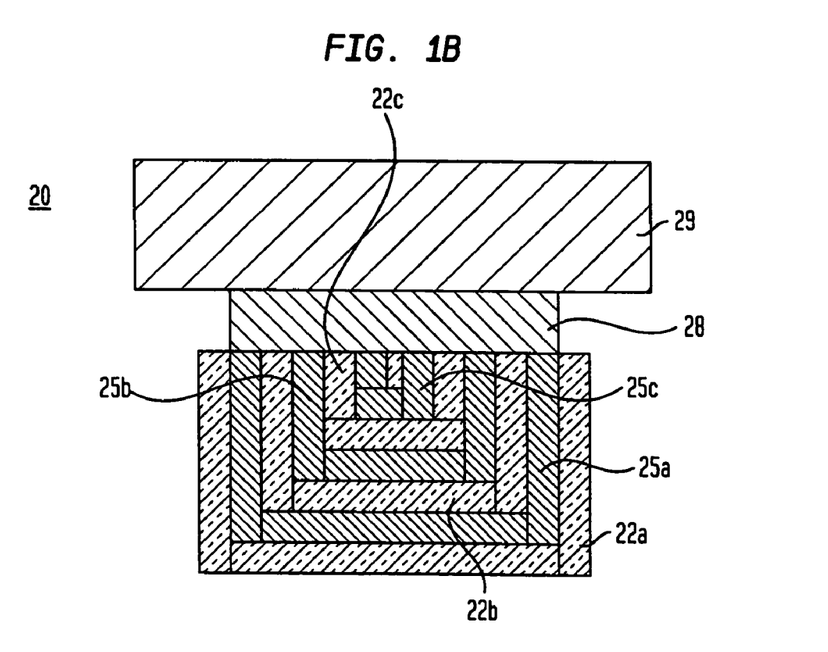

With respect to the embodiment depicted in FIG. 1(b), the thin film resistor 20 includes alternating conductive and insulating films in a trough configuration by repeating resistor material deposition and insulating material formation steps. In the structure depicted in FIG. 1(b), a plurality of alternating refractory metal films 25a,b,c in trough configuration having lateral and vertical formations and alternating insulator films 22a,b,c formed between the conductive layers is shown. As mentioned, this resistive element may be formed as part of an interlevel circuit or comprise part of an interconnect structure as shown connected to another wire level 29 by a conducting via 28 which is electrically connected to each of the conductor layers 25a,b,c. It is understood that the via may alternately connect some or all of the conductors in the achievement of a desired design parameter, e.g., resistance. In this structure, the plurality of film types may be chosen to have different thicknesses and widths to provide a desired matching of current carrying capability and TCR values. The insulator films and materials can also be chosen to provide the adhesion, thermal and mechanical desired features.

Figure 1C:
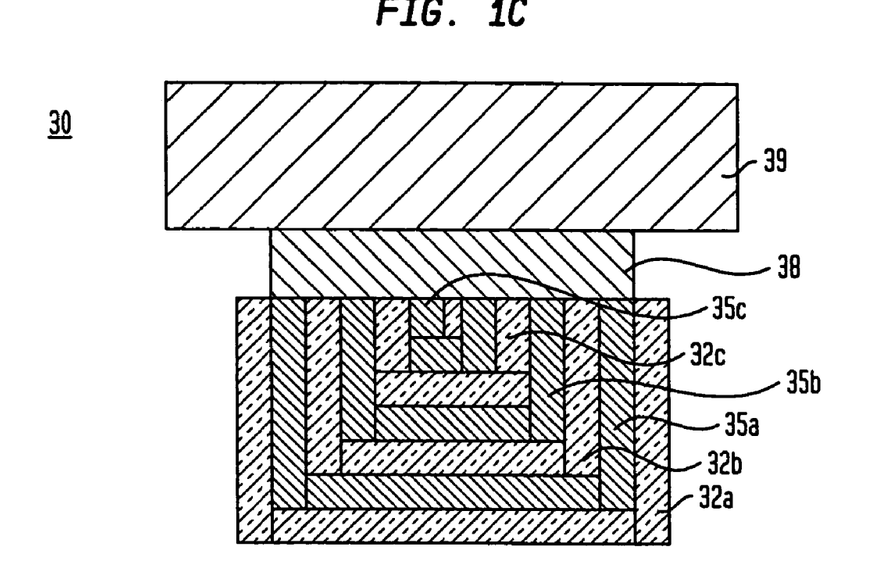

In an alternate embodiment, a resistive structure 30 depicted in the cross-section view of FIG. 1(c) includes a structure similar to that depicted in FIG. 1(b) comprising alternating conductive and insulative films in a trough configuration. In the embodiment depicted in FIG. 1(c), the conductor layers 35a,b,c having lateral and vertical formations each comprise a different material, e.g., having different TCR values, and designed to achieve a net TCR value, e.g., zero. In the resistive structure of FIG. 1(c), alternating insulator films 32a,b,c are formed between the conductive layers with each layer being the same material including, but not limited to: an oxide, nitride, oxynitride or any combination thereof including multilayers, porous or non-porous inorganic and/or organic dielectrics formed by a deposition process, including low-k materials and SiLK®. The alternating conductive layers include a resistive material including but not limited to: Ta, TaN, Ti, TiN, W, WN or other refractory metal films. As mentioned, this resistive element may be formed as part of an interlevel circuit or comprise part of an interconnect structure as shown connected to another wire level 39 by a conducting via 38 which is electrically connected to each of the conductor layers 35a,b,c. It is understood that the via may alternately connect some or all of the conductor layers of the trough to the adjacent wire level in the achievement of a desired design parameter, e.g., resistance.

Figure 1D:
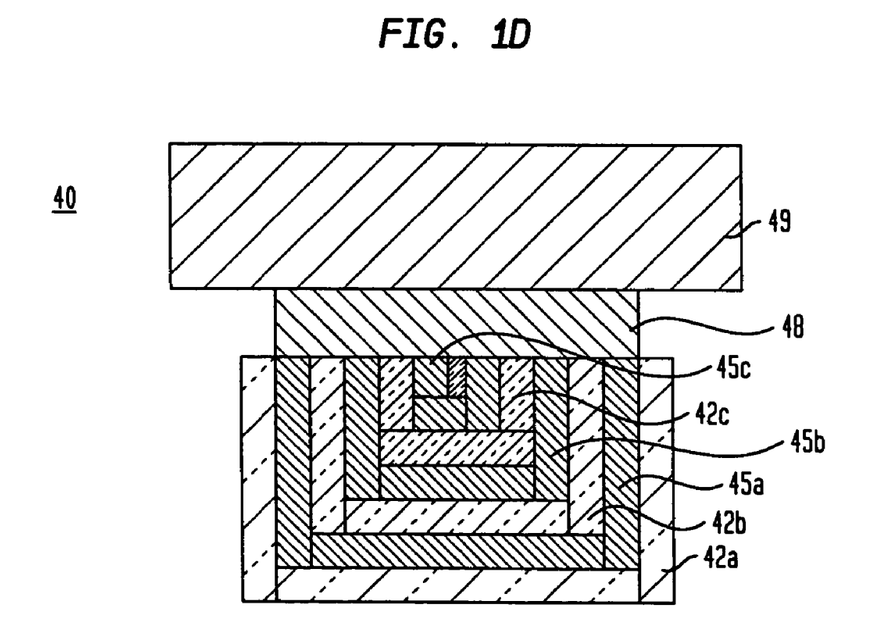

In another alternate embodiment, a resistive structure 40 depicted in the cross-section view of FIG. 1(d) includes a structure similar to that depicted in FIG. 1(b) comprising alternating conductive and insulative films in a trough configuration. In the embodiment depicted in FIG. 1(d), the conductor layers 45a,b,c having lateral and vertical formations with each layer comprising a different material, e.g., having different TCR values capable of being designed to achieve a desired net TCR value, e.g., zero. In the resistive structure of FIG. 1(d), alternating insulator films 42a,b,c are formed between the conductive layers with each layer comprising a different material including, but not limited to: an oxide, nitride, oxynitride or any combination thereof including multilayers, porous or non-porous inorganic and/or organic dielectrics formed by a deposition process. The alternating conductive layers include a resistive material including but not limited to: Ta, TaN, Ti, TiN, W, WN or other refractory metal films. As mentioned, this resistive element may be formed as part of an interlevel circuit or comprise part of an interconnect structure as shown connected to another wire level 49 by a conducting via 48 which is electrically connected to each of the conductor layers 45a,b,c. It is understood that the via may alternately connect some or all of the conductor layers of the trough to the adjacent wire level in the achievement of a desired design parameter, e.g., resistance.

Figure 3:
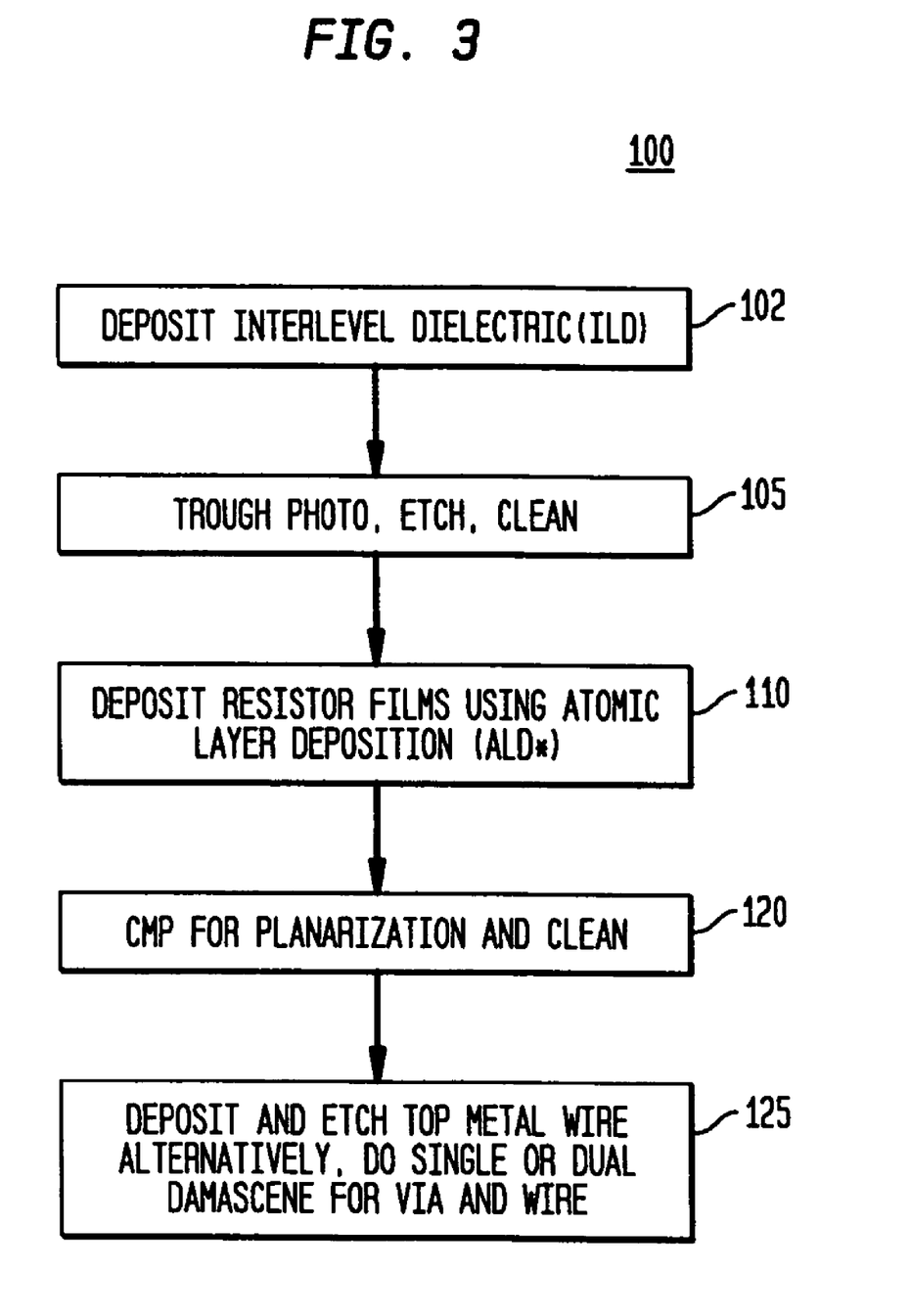
FIG. 3 depicts a flow chart including the steps of the present invention for fabricating the resistor structure of trough configuration as depicted in FIGS. 1(a)-1(d)
Figure 4:
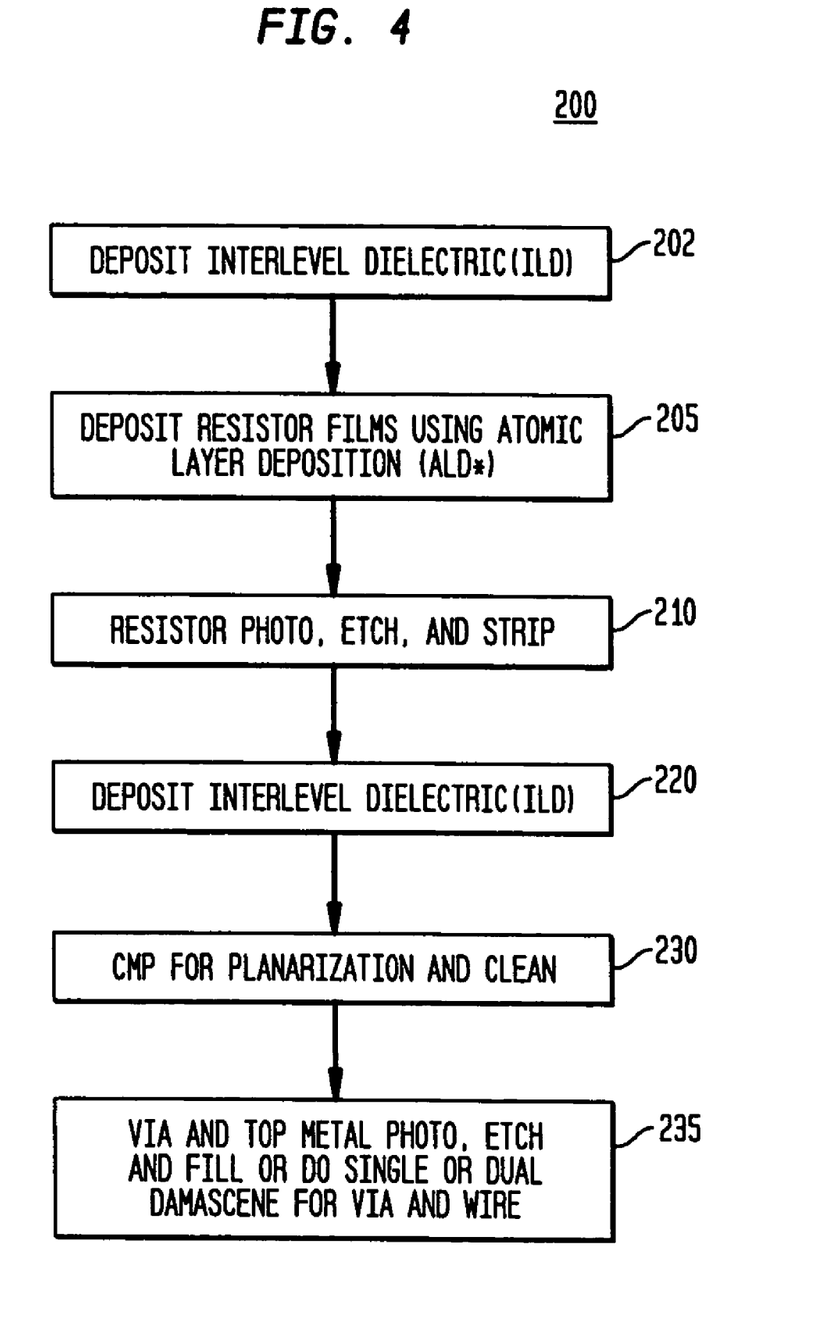
FIG. 4 depicts a flow chart including the steps of the present invention for fabricating the resistor structure of planar configuration as depicted in FIGS. 2(a)-2(c)

A methodology 100 for forming the resistive structures depicted in FIGS. 1(a)-1(d) is shown in FIG. 3 which includes a first step 102 of depositing a first interlevel dielectric layer, and, a further step 105 of implementing a conventional photolithographic technique for etching (e.g., Reactive Ion Etching) the trough structure, as depicted, and cleaning it. Then, as next depicted at step 110, a resistor film may then be deposited using an atomic layer deposition technique known in the art. Additionally, alternate dielectric levels may be deposited with alternating resistor films within the trough structure. Then, as depicted at step 120, a chemical mechanical polish (CMP) technique is used to planarize and clean the structure. As shown in further step 125, a top metal wire structure is deposited and etched. Known single or dual damascene techniques may be employed.

It should be understood that, in each of the resistive structures depicted in FIGS. 1(b)-1(d), due to the resistive nature of many of the refractory metals, a resistor film thickness may be chosen to provide lateral resistor ballasting across the resistor film. The lateral resistor ballasting is established if the material exhibits a lateral resistance of greater than 10 to 50 Ohms. Lateral ballasting can provide lower peak current and distributes the current and thermal stress at the insulator sidewalls. At high frequencies, the skin depth alters the current distribution. However, using thin films that are resistive and wide prevents redistribution of current. Vertical ballasting is additionally provided by the presence of insulator films between the conductive films. The vertical ballasting is achieved since the current does not flow between the films. To avoid skin effect vertical redistribution, the insulators serve as a means of preventing vertical current redistribution. By using resistive materials of different TCR values, the TCR value of the net resistor element can be tuned. The magnitude of the different contributions is preferably balanced by both material and width or thickness contributions to the net resistor element. To control the temperature rise in the resistor, various materials can be used to influence the thermal resistance and thermal capacitance. The net temperature rise is a function of the distance from the substrate (what metal level the resistor is on), the insulating layer type and thickness.

Figure 2A:
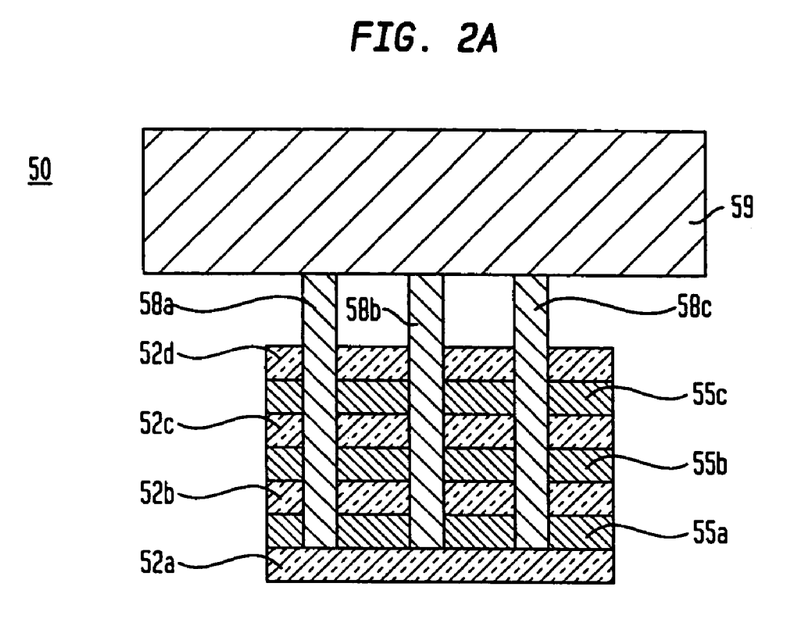
FIGS. 2(a)-2(c) depict various embodiments of the resistor element of the present invention (through cross sectional views) that comprises a multitude of dielectric and conductive layers deposited in a planar configuration.

In another embodiment of the invention, depicted in the cross-section view of FIG. 2(a), there is shown a resistive structure 50 including multiple alternating conductive and insulating layers. In this embodiment, the resistive structure 50 is a planar stack of conductive layers 55a,b,c and insulating layers 52a,b,c,d, for example. In the resistive structure 50 of FIG. 2(a), the alternating conductive films are of the same material and may comprise a resistive material including but not limited to: Ta, TaN, Ti, TiN, W, WN or other refractory metal films. Further, the alternating insulating films are of the same material and may comprise a dielectric material including, but not limited to: an oxide, nitride, oxynitride or any combination thereof including multilayers, porous or non-porous inorganic and/or organic dielectrics formed by a deposition process. The resistive element may be formed as part of an interlevel circuit or comprise part of an interconnect structure as shown connected to another wire level 59 by one or more conducting vias 58a,b,c which electrically connects each conductor layer 55a,b,c to the adjacent wire level. It is understood that the vias may alternately connect some or all of the conductor layers of the multi-layer planar resistive structure 50 to the adjacent wire level 59 in the achievement of a desired design parameter.

Figure 2B:
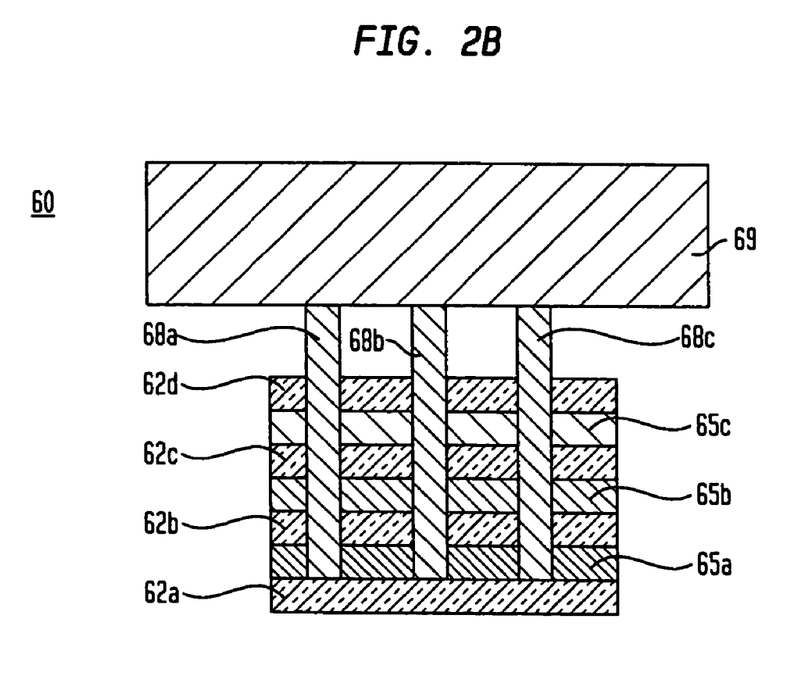

In another embodiment depicted in the cross-section view of FIG. 2(b), there is shown a resistive structure 60 including multiple alternating conductive and insulating layers. In this embodiment, the resistive structure 60 is a planar stack of conductive layers 65a,b,c and insulating layers 62a,b,c,d, for example. In the resistive structure 60 of FIG. 2(b), the alternating conductive films each comprise a different conductive material and each alternating insulating film may comprise the same dielectric material. As in the other embodiments depicted herein, vias 68a,b,c, may alternately connect some or all of the conductor layers of the multi-layer planar resistive structure 60 to the adjacent wire level 69 in the achievement of a desired design parameter.

Figure 2C:
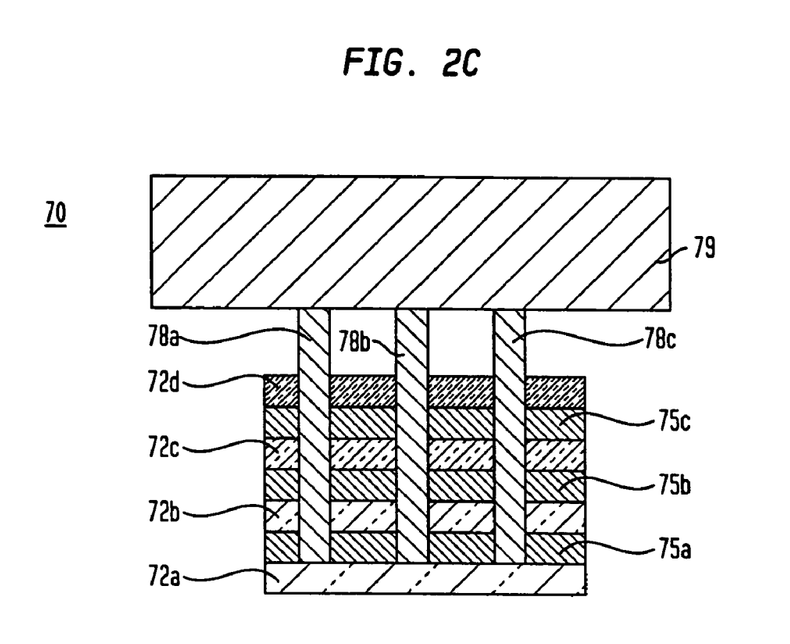

In another embodiment depicted in the cross-section view of FIG. 2(c), there is shown a resistive structure 70 including multiple alternating conductive and insulating layers. In this embodiment, the resistive structure 70 is a planar stack of conductive layers 75a,b,c and insulating layers 72a,b,c,d, for example. In the resistive structure 70 of FIG. 2(c), the alternating conductive films each comprise a same conductive material and each alternating insulating film may comprise a different dielectric material. The vias 78a,b,c may connect some or all of the conductor layers of the multi-layer planar resistive structure 70 to an adjacent wire level 79 in the achievement of a desired design parameter.

A methodology 200 for forming the resistive structures depicted in FIGS. 2(a)-2(c) include a first step 202 of depositing a first interlevel dielectric layer, and, a further step 205 of implementing an atomic layer deposition technique known in the art depositing a resistor film. Next at step 210, using convention photolithographic techniques, the resistor layer is then etched and stripped at designed locations to accommodate the formed via structures. Then, as depicted at step 220, a further interlevel dielectric level may be deposited with alternating resistor films within the trough structure. These steps may be repeated to form the alternating conductive and insulating structures with the formed via structures. Then, as depicted at step 230, a chemical mechanical polish (CMP) technique is used to planarize and clean the structure. As shown in further step 235, a top metal wire structure is deposited and etched with via fill. Known single or dual damascene techniques may be employed.

It should be understood that, in each of the resistive structures depicted in FIGS. 2(a)-2(c), the lateral resistor ballasting is established if the conductive materials exhibit a lateral resistance of greater than 10 to 50 Ohms. Lateral ballasting can provide lower peak current and distributes the current and thermal stress at the insulator sidewalls. At high frequencies, the skin depth alters the current distribution. However, using thin films that are resistive and wide prevents redistribution of current. Vertical ballasting is additionally provided by the presence of insulator films between the conductive films. The vertical ballasting is achieved since the current does not flow between the films. To avoid skin effect vertical redistribution, the insulators serve as a means of preventing vertical current redistribution, i.e., serves as a means for limiting current flow perpendicular to the insulator film surfaces. Further, by using resistive materials of different TCR values, the TCR value of the net resistor element can be tuned. The magnitude of the different contributions is preferably balanced by both material and width or thickness contributions to the net resistor element. Moreover, to control the temperature rise in the resistor, various materials can be used to influence the thermal resistance and thermal capacitance. The net temperature rise is a function of the distance from the substrate (what metal level the resistor is on), the insulating layer type and thickness. For instance, it is desired that the insulator film layers are thinner than the adjacent conductive layers so that the thermal conductivity difference and temperature gradient, from one conductor to another, is reduced or negligible. This is desirable because the more uniform the temperature is across the physical structure the less temperature gradient and hence, less thermal stress which can cause cracking. By making thin dielectric layers, the thermal gradient is very small laterally thus maintaining temperature uniformity because of the self-ballasting of the film. Furthermore, it is desired that the insulator layers are uniform is undesirable because, difference in thickness may contribute to bad modeling in the modeling techniques described hereinafter.

The present invention additionally provides for a Computer Aided Design (CAD) methodology and structure for providing design, verification and checking of high current characteristics and ESD robustness of a resistor element in an analog, digital, and RF circuits, system-on-a-chip environment in a design environment which utilizes parameterized cells. That is, a CAD strategy is implemented that provides design flexibility, RF characterization and ESD robustness of the resistor element. This resistor element may be constructed in a primitive or hierarchical "parameterized" cell, hereinafter referred to as a "p-cell", which may be constructed into a higher level resistor element. This resistor element may further be integrated into a hierarchical structure that includes other elements which do not necessarily include resistor elements, and becomes a component within the hierarchical structure of the network. These resistor elements may be the lowest order p-cells and capable of RF and dc characterization. High current analysis, ESD verification, dc characterization, schematics and LVS (Logical Verification to Schematic) are completed on the resistor element. Elements that may be integrated into a hierarchical network may comprise diode, bipolar and MOSFET hierarchical cells. The parameterized cells, or "p-cells", may be constructed in a commercially available CAD software environment such as CADENCE®-(Cadence Design Systems, Inc., San Jose, Calif.), e.g., in the form of a kit.

Figure 5:
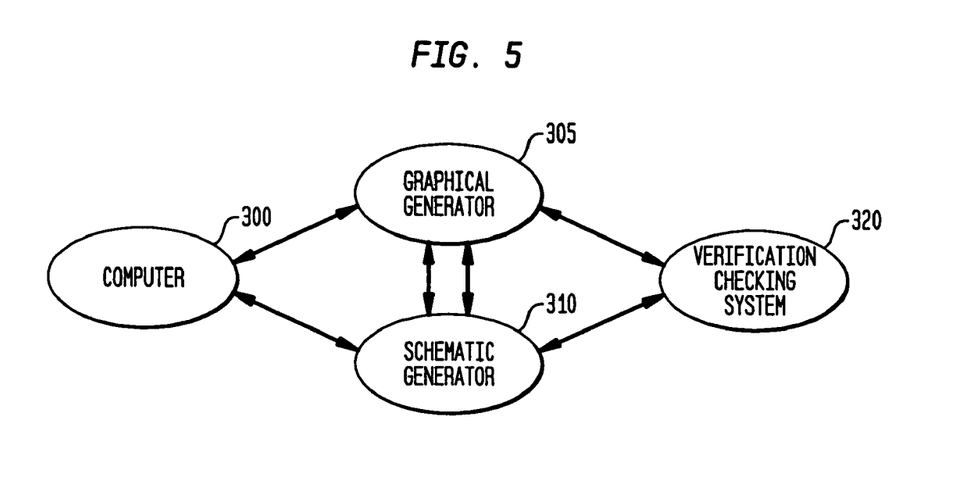
FIG. 5 depicts a CAD design tool concept whereby a computer is implemented that interacts with Graphical generator and Schematic generator sub-systems according to the present invention.
Figure 6:
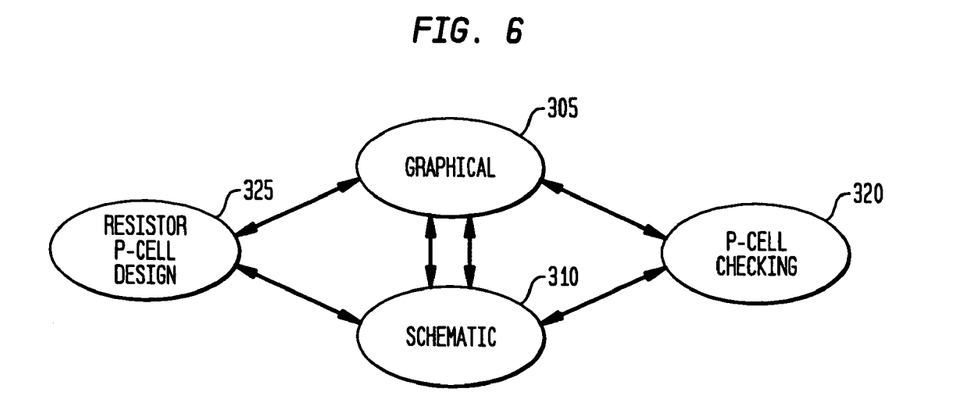
FIG. 6 depicts the graphical and schematic design sub-systems accessible via a user interface for designing a resistor p-cell according to the present invention.

FIG. 5 illustrates a CAD design tool concept whereby a computer 300 is implemented that interacts with Graphical generator and Schematic generator processing sub-systems 305, 310, respectively. These graphical and schematic generator sub-systems interact with each other to aid in the generation of resistor p-cells, e.g., including the resistor structures as described herein. For instance, the graphical generator 305 generates a physical layout of a resistor structure and the schematic generator 310 will generate a schematic view of the structure that is suitable for specification in a designed circuit. All designs generated by the system are subject to a verification checking sub-system 320 to verify design integrity and ensure no technology rules are violated. Thus, for instance, as shown in detail in FIG. 6, via a user interface, a resistor p-cell 325 is designed via the graphical and schematic design sub-systems 305, 310 and the design system and the verification checking sub-system 320 will implement design checking rules, e.g., check the physical layout of the p-cell and ensure that it conforms to physical layout rules or violates any technology rules, for example.

Figure 7:
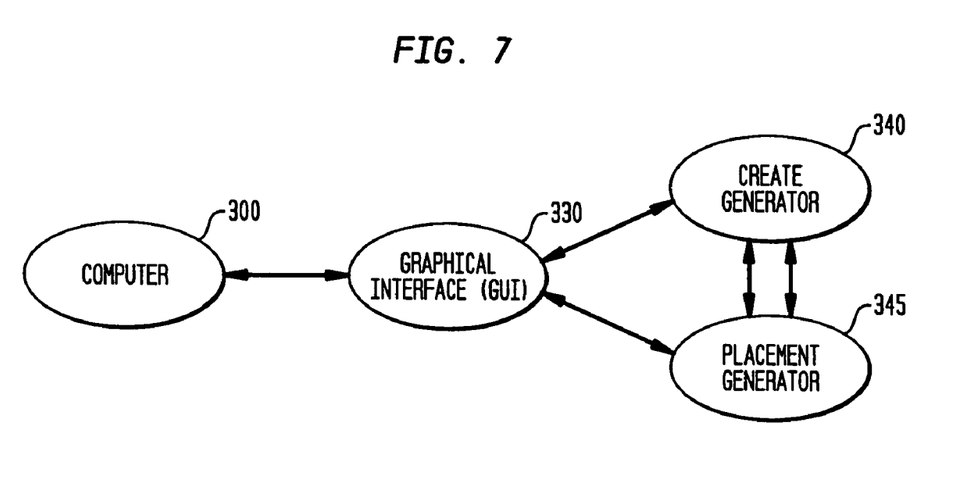
FIG. 7 depicts an implementation of the design system of the present invention implemented in CADENCE for designing the resistor p-cell elements and generating circuits employing the resistor p-cells.

FIG. 7 depicts an implementation of the design system of the present invention implemented in CADENCE. Via the graphical user interface (GUI) 330 of computer device 300, create generator module 340 and placement generator module 345 are implemented for designing the resistor p-cell elements and generating circuits employing the resistor p-cells, respectively. In the design of the resistor p-cell element, several views are possible including a layout (graphical) view, a schematic view and/or a symbol view which enables generation of a symbol, for instance, having associated stored physical information.

Figure 8A:
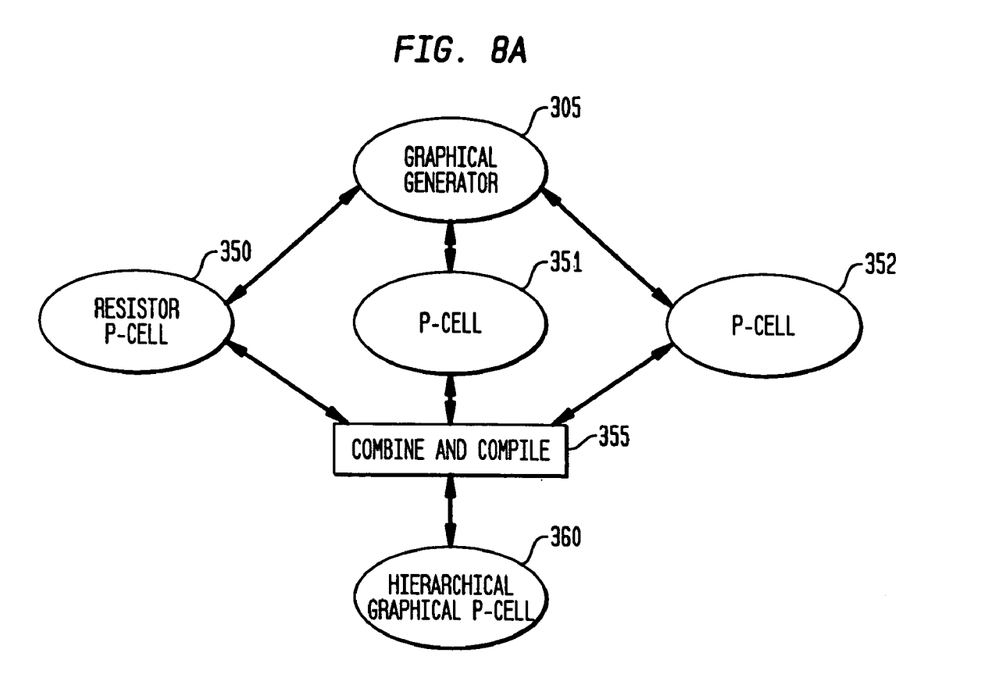
FIG. 8(a) depicts conceptually the p-cell graphical design system 350 according to the invention and, FIG. 8(b) depicts conceptually, the p-cell schematic design system 370 according to the invention.
Figure 8B:
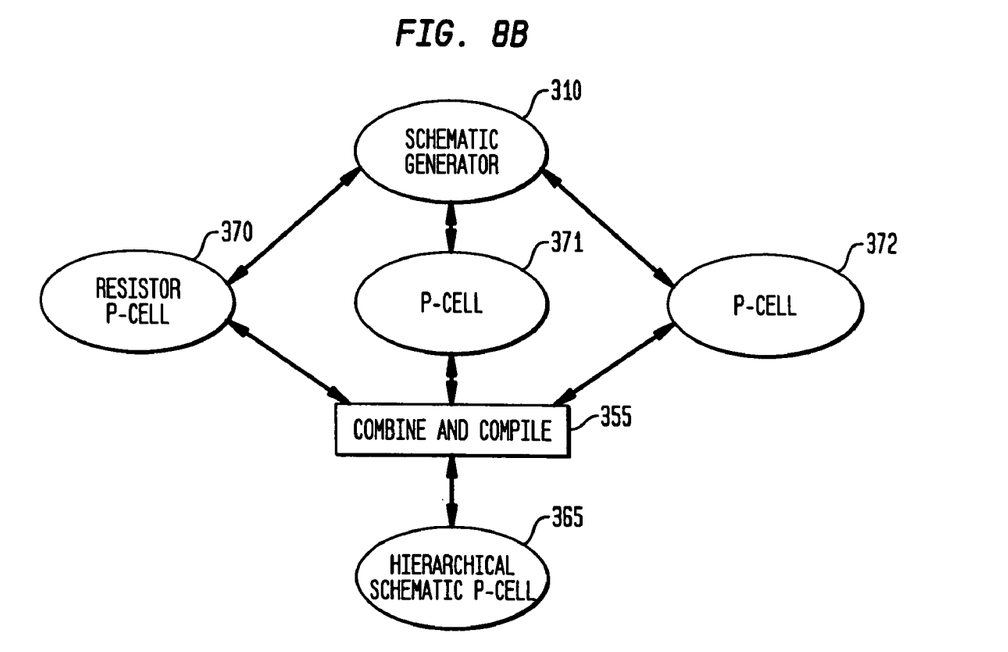

FIG. 8(a) depicts conceptually, the p-cell graphical design system 350 according to the invention. As shown in FIG. 8(a), functionality provided via graphical generator 305 is invoked to design graphic p-cells, e.g., a resistor p-cell 350. P-cell elements 351, 352 may be combined and merged by a compile function to generate a hierarchical graphical p-cell 360, or a higher order element. Thus, for instance, a second order resistor element may be generated inheriting parameters of a lower p-cell (e.g. a single order) resistor element. The same analysis is applicable for the schematic generation sub-system. FIG. 8(b) depicts conceptually, the p-cell schematic design system 370 according to the invention. As shown in FIG. 8(b), functionality provided via schematic generator 310 is invoked to design schematic p-cells, e.g., a resistor circuit element p-cell 370. Circuit p-cell elements 371, 372 may be combined and merged by the compile function 355 to generate a hierarchical schematic p-cell, or a higher order circuit element 365. The p-cells 360, 365 are hierarchical and built from device primitives which have been RF characterized and modeled. Without the need for additional RF characterization, the design kit development cycle is compressed. Autogeneration also allows for DRC (Design Rule Checking) correct layouts and LVS correct circuits.

Thus, as exemplified in FIGS. 8(*a*) and 8(*b*), resistor p-cells are "growable" elements such that they can form repetition groups of an underlying p-cell element to accommodate the design parameters. That is, they can be changed in physical size based on the criteria autogenerated. The p-cells fix some variables, and pass some variables to higher order p-cell circuits through inheritance. For example, from a base resistor p-cell 350, there can be constructed a plurality of p-cells 351, 352 where each conductive layer is a p-cell and the composite resistor element 360 is a hierarchical p-cell comprising of the plurality of conductive films such as described herein with respect to FIGS. 1 and 2. The plurality of films can be constructed within a given primitive p-cell.

Figure 9A:
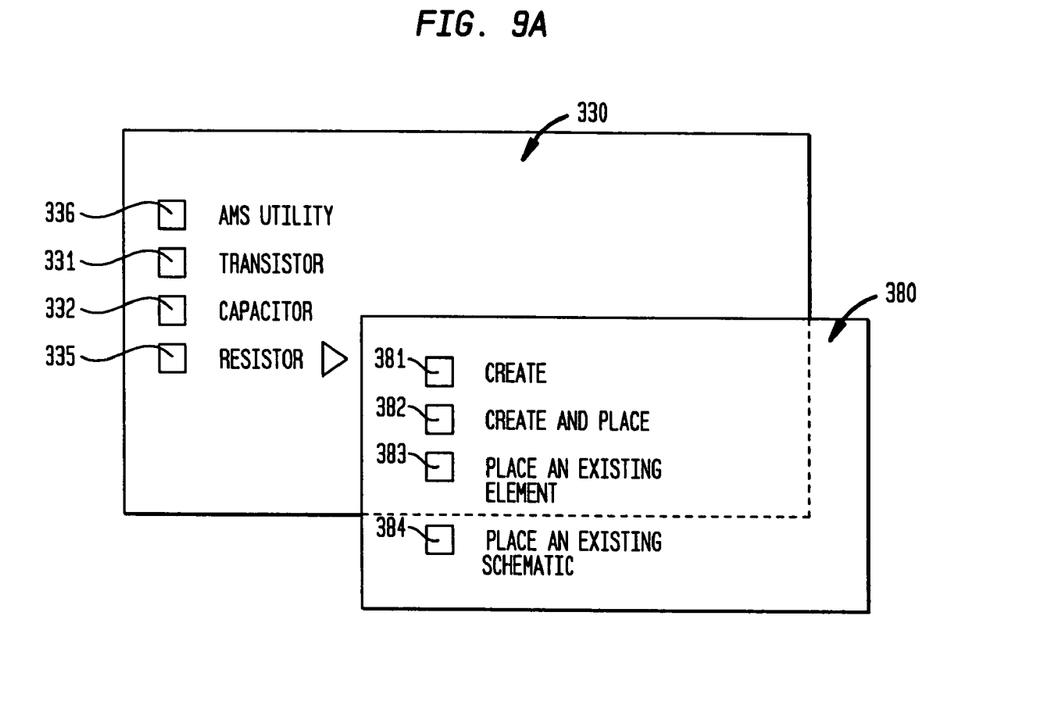
FIG. 9(a) depicts an exemplary schematic editing graphical unit interface (GUI) 330, invoking functionality for constructing a variety of p-cell elements.

As an example of the schematic methodology, FIG. 9(*a*) depicts an exemplary schematic editing graphical unit interface (GUI) 330, invoking functionality for constructing a transistor p-cell 331, a capacitor p-cell 332, or a resistor p-cell 335 or, for invoking an AMS (Analog Mixed Signal) utility choice 336. For example, upon selection of the resistor p-cell 335, a resistor pull-down menu 380 is displayed providing design options including: Create a resistor element choice 381, Create and place a resistor element choice 382, place an existing resistor element choice 383, and place a resistor schematic choice 384. In the CAD design system aspect of the invention, the schematic p-cell is generated by the input variables to account for the inherited parameters input values. To retain resistor circuit variability, a design flow has been built around the schematic p-cell.

Figure 9B:
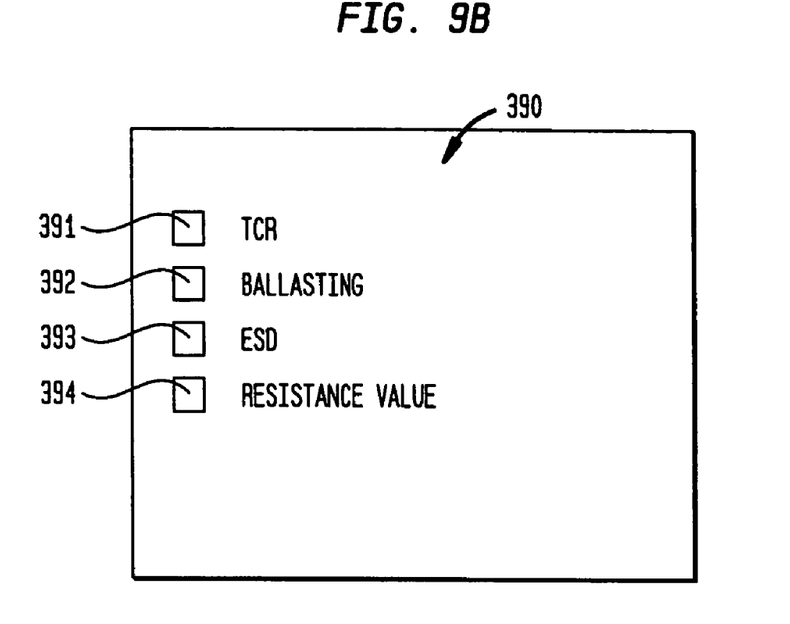
FIG. 9(b) depicts a pull-down design panel that requests the designer to input parameters in the design of a resistor p-cell.

As an example, the selection of "Create a resistor element" function 381 initiates creation of a schematic for a parameterized resistor cell (resistor p-cell). To generate the electrical schematic, via the pull-down menu 390 depicted in FIG. 9(*b*), the design panel requests the designer to input parameters, such as: TCR 391, Ballasting 392, ESD protection 393 and a net resistance value 394. Other parameters of interest or desired features that may be entered via the GUI include, but are not limited to: the width, the length, the net total resistance, the maximum mechanical stress integrity value, the maximum peak temperature thermal integrity value, the mechanical or thermal strain limit, the resistance, the worst case capacitance, the worst case inductance, the Q (quality factor), the worst case TCR, the high current limit, the worst case ESD robustness level (e.g., human body model (HBM)), machine model (MM), charged device model (CDM), transmission line pulse current (TLP)), and other design parameters. This implementation and definition is performed via input from the GUI to define the parameters. It is understood that other resistor parameters may additionally be integrated with the design system.

Figure 9C:
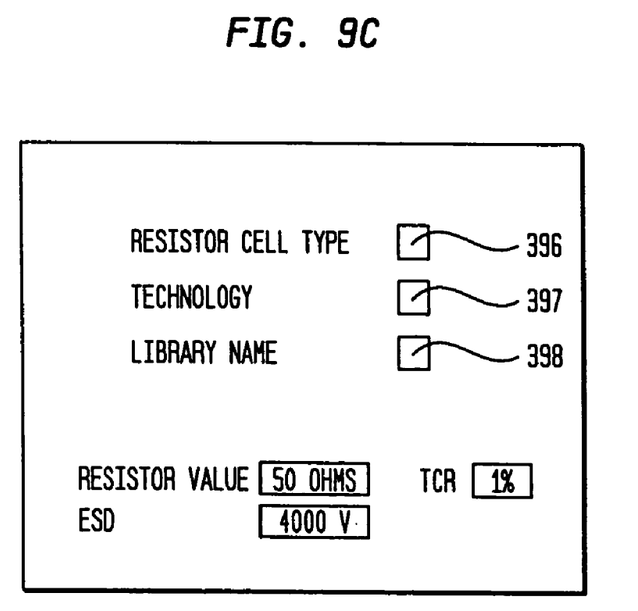
FIG. 9(c) illustrates an example resistor p-cell GUI panel showing a built resistor P-cell having attributes including: a resistor cell type, a type of technology, a library name, a resistor value, a TCR value and an ESD value.

These input parameters are passed into a procedure that will build a resistor p-cell with the schematic p-cell built according to the input parameters and placed in the designated resistor cell. An instance of the resistor layout p-cell will also be placed in the designated resistor cell. For example, FIG. 9(*c*) illustrates an example resistor p-cell GUI panel showing a built resistor P-cell having attributes including: a resistor cell type 396, a type of technology 397, a library name 398, a resistor value (e.g. 50 Ohms), a TCR value (e.g., 1%) and an ESD value (e.g., 4000 V).

Figure 10:
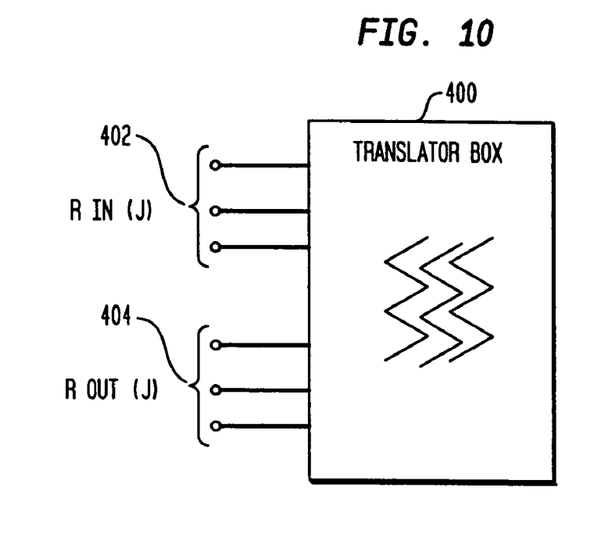
FIG. 10 illustrates hierarchical p-cell information included in a "translation box" that includes a plurality of input connections and output connections that may be later specified for connection in a circuit to achieve a certain performance.
Figure 11:
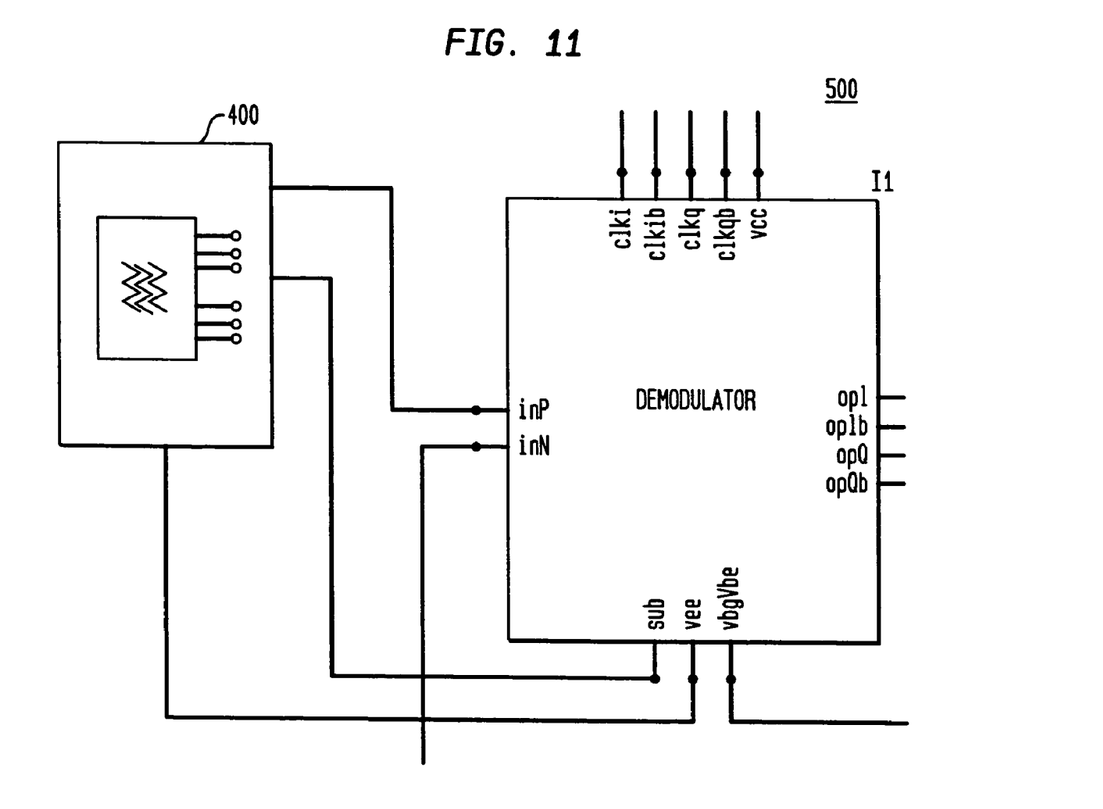
FIG. 11 depicts a symbol view representing a designed resistor that may be specified for connection in an RF circuit, for example.

In the computer aided design (CAD) system and methodology, a parameterized cell (p-cell) is thus constructed as a primary cell or a hierarchical cell consisting of a plurality of primitive cells to generate the resistor element. The resistor element parameters can be chosen from electrical circuit values, and/or RF features desired. From the electrical schematic, a symbol function can be created representing and containing all the information of the resistor p-cell. In the case of the resistor p-cell, the hierarchical p-cell information is included in a "translation box" 400 such as shown in FIG. 10 that include a plurality of input connections 402 and output connections 404 that may be later specified for connection in a circuit to achieve a certain performance or parameter value, e.g., a resistance or ESD robustness value, when included in a circuit application. For instance, a symbol view 400, representing the built resistor, may be specified for connection in an RF circuit 500 such as shown in FIG. 11, for example, by selecting a "Place an resistor circuit" option (not shown) via the GUI. Generation of the graphical implementation is achievable using the translation box that generates the graphical implementation of the resistor element. The graphical implementation will have the information stored in the translation box and may reconstruct the multi-film resistor design implementing the variable information stored constraints contained in the translation box.

The CAD design kit of the present invention further enables the automated building of a resistor library by creating and storing both schematic, layout, and symbol views of the p-cell element including associated specified input parameters and physical models.

For instance, as electrical and thermal characteristics of a design are additionally influenced by the surrounding insulator films, and "fill shapes" placed around the film, in the implementation of the invention, the physical model for evaluation of the electrical and thermal characteristics include algorithms or physical models that characterize the physical structure. These can also be obtained from experimental work and a "look-up table" that may be placed in the design system as a GUI to assist the user in choosing the parameters of interest. For example, the Smith-Littau model is used to determine the maximum current and voltage across a resistor element as a function of an applied pulse width or energy. As known to skilled artisans, various models exist that allow quantification of the electrical and thermal failure of the structure. The p-cell may be a GUI that allows generation of the fill-shapes to modify the thermal characteristics of the resistor film. The GUI may be used also to choose whether the surrounding interlevel dielectric films are high-k or low-k materials.

The resistor element design may further allow for "Cheesing" which is a process where holes are placed in a film to establish mechanical stability of the element. If the user desires the resistor element may be auto-cheesed. This will allow thermal and mechanical stability wherein the design would auto-adjust to the correct size to achieve the other desired parameters.

The design system further provides a tunable thermal resistance feature that attempts to satisfy the desired characteristic by material changes, widths, dielectric film spacing, and material types. Additionally, it can change the thermal impedance, thermal resistance and thermal capacitance as well as Quality Factor (QF) or Q of the resistor by adjusting the electrical capacitance, inductance and other parasitic features.

Further, according to the invention, a methodology is provided that allows for the auto-generation of the schematic circuit to be placed directly into the design. This procedure is available with a "Place a resistor schematic" option (not shown) via the user GUI that enables the designer to auto-generate the circuit and place it in the schematic. Since these cells are hierarchical, the primitive devices and auto-wiring are placed by creating an instance of the schematic p-cell and then flattening the element.

To maintain the hierarchy during the layout phase of the design, an instance box is placed in the schematic retaining the input parameters and device names and characteristics as properties and the elements are recognized and the primitives are replaced with the hierarchical p-cell.

To produce multiple implementations using different inherited parameter variable inputs, different embodiments of the same circuit type may be created by the methodology of the invention. In this process, the schematic is renamed to be able to produce multiple implementations in a common chip or design; the renaming process allows for the design system to distinguish multiple cell views to be present in a common design.

When the inherited parameters are defined, the circuit schematic is generated according to the selected variables. For example, substrate, ground and pin connections are established for the system to identify the connectivity of the circuit.

The design system may additionally auto-generate the layout from the electrical schematic which will appear as equivalent to the previously discussed graphical implementation.

The physical layout of the resistors circuits is implemented with p-cells using existing primitives in the reference library. The circuit topology is formed within the p-cell including wiring such that all parasitics may be accounted for.

It should be understood that the design system and methodology permits for change of circuit topology as well as structure size of the resistor structure in an automated fashion. Layout and circuit schematics are auto-generated with the user varying the number of elements in the circuit. The circuit topology automation allows for the customer to auto-generate new resistor elements without additional design work. Interconnects and wiring to and between the resistor elements are also auto-generated.

The resistor elements described herein with respect to FIGS. 1 and 2 and embodied as a hierarchical parameterized cell designed via the CAD tool kit of the invention, may thus be designed with the following achievable design objectives including, but not limited to: 1) verification of the connection between a first and second element by verifying and checking electrical connectivity wherein the first element is a p-cell and the second element is a p-cell; 2) verification of the width requirements to maintain high current and ESD robustness to a minimum level; 3) verify that based on the high current or ESD robustness of the ESD network that the resistor width and via number is such to avoid electrical interconnect failure prior to the ESD network failure; 4) allow for parallel resistors whose cross section can be maintained and evaluated as a set of parallel resistors; 5) allow for "resistor ballasting" by dividing into a plurality or array of resistors; 6) allow for calculation of the high current robustness of the resistor based on pulse width, surrounding insulator materials (e.g. $SiO_2$ or low K materials), metal level and distance from the substrate (thermal resistance based on the metal level or underlying structures; 7) account for surrounding fill shapes around the resistor p-cell; and, 8) account and adjust for "cheesing" (removal of interconnect material inside the interconnect) of the resistor element.

Various modifications may be made to the structures of the invention as set forth above without departing from the spirit and scope of the invention as described and claimed. Various aspects of the embodiments described above may be combined and/or modified.

While the invention has been particularly shown and described with respect to illustrative and preferred embodiments thereof, it will be understood by those skilled in the art that the foregoing and other changes in form and details may be made therein without departing from the spirit and scope of the invention that should be limited only by the scope of the appended claims.

The invention claimed is:

1. A method of forming a semiconductor resistor structure comprising the steps of:
 a) providing an interlevel dielectric material structure;
 b) etching a trough structure in said dielectric structure;
 c) depositing a layer of conductive material having lateral and vertical portions in said trough structure;
 d) depositing a layer of insulator material having lateral and vertical portions above said layer of conductive material in said trough structure;
 e) alternating deposition of conductive and insulator material layers according to steps c) and d) to form said resistor structure having properties tailored according to types and thicknesses of said conductive and insulator materials;
 f) planarizing a surface of said resistor structure; and,
 g) forming a via structure above said planarized surface to connect a top surface of each said vertical portions of said conductive film layers of said resistor structure to an adjacent wire level.

2. The method according to claim 1, wherein the alternating conductive layers comprise a refractory metal having a high sheet resistance.

3. The method according to claim 2, wherein the alternating insulator film layers provide vertical self-ballasting, and the metal film layers exhibit a lateral self-ballasting effect created by the high resistance of the refractory metal.

4. The method according to claim 1, wherein the step of alternating deposition of conductive and insulator material layers according to steps c) and d) enables tuning of a Temperature Coefficient of Resistance value for said resistor structure.

5. The method according to claim 1, wherein the step of alternating deposition of conductive and insulator material layers according to steps c) and d) form a resistor structure having increased ESD robustness.

6. A method of forming a semiconductor resistor structure comprising the steps of:
 a) providing an interlevel dielectric material structure;
 b) depositing a layer of conductive material in a planar orientation;
 c) depositing a layer of insulator material having in a planar orientation above said layer of conductive material;
 d) alternating deposition of conductive and insulator material layers according to steps b) and c) to form a multi-stack resistor structure having properties tailored according to types and thicknesses of said conductive and insulator materials; and,
 e) forming one or more vertically oriented via structures to connect each of said conductive film layers of said resistor structure to an adjacent wire level, at least two of the conductive material layers being electrically connected in parallel.

7. The method according to claim 6, wherein the alternating conductive layers comprise a refractory metal having a high sheet resistance.

8. The method according to claim 7, wherein the alternating insulator film layers provide vertical seif-ballasting, and the metal film layers exhibit a lateral self-ballasting effect created by the high resistance of the refractory metal.

9. The method according to claim 6, wherein the step of alternating deposition of conductive and insulator material layers according to step d) enables tuning of a Temperature Coefficient of Resistance value for said resistor structure.

10. The method according to claim 6, wherein the step of alternating deposition of conductive and insulator material layers according to steps c) and d) form a resistor structure having increased ESD robustness.

11. The method according to claim 6, wherein said step e) of forming one or more via structures to connect or more of said conductive films include utilizing single or dual damascene processes for forming said vias to connect one or more conductive films in parallel.

* * * * *